US011706879B2

(12) United States Patent
Koskinen et al.

(10) Patent No.: US 11,706,879 B2
(45) Date of Patent: Jul. 18, 2023

(54) SUBRACK AND MODULE ASSEMBLY COMPRISING THE SUBRACK

(71) Applicant: ABB Schweiz AG, Baden (CH)

(72) Inventors: Matti Koskinen, Helsinki (FI); Toni Nygren, Helsinki (FI); Joonas Puukko, Helsinki (FI)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 17/656,839

(22) Filed: Mar. 28, 2022

(65) Prior Publication Data

US 2022/0312600 A1 Sep. 29, 2022

(30) Foreign Application Priority Data

Mar. 29, 2021 (EP) .................................... 21165570

(51) Int. Cl.
*H05K 5/00* (2006.01)
*H05K 5/02* (2006.01)

(52) U.S. Cl.
CPC .......... *H05K 5/0008* (2013.01); *H05K 5/0021* (2013.01); *H05K 5/0217* (2013.01); *H05K 5/0256* (2013.01)

(58) Field of Classification Search
CPC .. H05K 5/0008; H05K 5/0021; H05K 5/0217; H05K 5/0256; H05K 7/1411; H05K 7/14324; H05K 7/14325; H05K 7/1435; H05K 5/0247
See application file for complete search history.

(56) References Cited

U.S. PATENT DOCUMENTS

| | | | | |
|---|---|---|---|---|
| 5,128,830 A * | 7/1992 | Deluca | ................. | H05K 7/1454 361/752 |
| 5,838,533 A * | 11/1998 | Yazaryan | ............. | H05K 7/1427 361/600 |
| 6,169,249 B1 * | 1/2001 | Teachout | ................. | H05K 7/16 174/559 |
| 6,293,828 B1 * | 9/2001 | Colver | ................. | H05K 7/1457 439/680 |
| 6,594,078 B2 * | 7/2003 | Clifton | ................... | G03B 21/10 353/74 |
| 8,162,417 B2 * | 4/2012 | Briggs | ...................... | G06F 1/30 312/334.4 |

(Continued)

FOREIGN PATENT DOCUMENTS

CN 204014349 U 12/2014
WO 2020141660 A1 7/2020

OTHER PUBLICATIONS

European Search Report; Application No. EP 21 16 5570; dated Sep. 7, 2021; 2 Pages.

*Primary Examiner* — Abhishek M Rathod
*Assistant Examiner* — Keith DePew
(74) *Attorney, Agent, or Firm* — Whitmyer IP Group LLC

(57) ABSTRACT

A subrack including a frame defining a subrack space and adapted to receive a device module to an operative position, the frame comprising four side walls and an end wall. The subrack comprises a coupling system adapted for coupling the subrack to four other subracks in order to form a subrack matrix, the coupling system comprising at least one wall recess on an inner surface of each of the side walls, and at least one primary screw hole in each of the side walls such that the at least one primary screw hole is located in the at least one wall recess.

17 Claims, 5 Drawing Sheets

(56) References Cited

U.S. PATENT DOCUMENTS

| | | | | |
|---|---|---|---|---|
| 8,958,210 | B2* | 2/2015 | Hiller | H02M 7/4835 |
| | | | | 361/730 |
| 9,185,975 | B2* | 11/2015 | Franklin | H05K 7/14 |
| 9,380,702 | B2* | 6/2016 | Fricker | G06F 1/183 |
| 10,877,528 | B2* | 12/2020 | Smethurst | G06F 1/181 |
| 11,240,936 | B2* | 2/2022 | Chehade | H05K 7/1488 |
| 11,425,996 | B2* | 8/2022 | DeShon | A47B 87/008 |
| 2004/0070922 | A1* | 4/2004 | Erskine | H05K 7/1411 |
| | | | | 361/601 |
| 2005/0242774 | A1* | 11/2005 | Marraffa | H01M 10/6561 |
| | | | | 361/730 |
| 2008/0164794 | A1 | 7/2008 | Lai et al. | |
| 2008/0278889 | A1* | 11/2008 | Briggs | H05K 7/1424 |
| | | | | 361/608 |
| 2008/0278904 | A1* | 11/2008 | Carr | G06F 1/187 |
| | | | | 361/725 |
| 2012/0242200 | A1* | 9/2012 | Keragala | A47B 47/042 |
| | | | | 312/107 |
| 2014/0022738 | A1* | 1/2014 | Hiller | H05K 7/1432 |
| | | | | 361/730 |
| 2014/0334084 | A1* | 11/2014 | Fricker | H05K 5/0021 |
| | | | | 361/679.02 |
| 2018/0020566 | A1 | 1/2018 | Hirata et al. | |
| 2018/0316164 | A1* | 11/2018 | Jung | H02H 7/22 |

* cited by examiner

SUBRACK AND MODULE ASSEMBLY COMPRISING THE SUBRACK

FIELD OF THE INVENTION

The present invention relates to a subrack for receiving a device module, and to a module assembly comprising said subrack and a device module adapted to be received in the subrack.

BACKGROUND OF THE INVENTION

A known electrical assembly comprises an electrical cabinet and a plurality of device modules received in the electrical cabinet. Each of the device modules comprises an electrical device such as a frequency converter, and a device module connector system. The electrical cabinet comprises a cabinet connector system adapted to be in electrically conducting connection with the device module connector system. The device modules are installed to the electrical cabinet by pushing them into their operative positions relative to the electrical cabinet.

One of the problems associated with the above known electrical assembly is that if a location of the cabinet connector system differs from its intended location, pushing a device module into the electrical cabinet might damage the cabinet connector system and/or the device module connector system. Said problem is in some cases caused by a fact that an electrical cabinet of an electrical assembly is assembled by a supplier different than the one supplying device modules for the electrical assembly.

BRIEF DESCRIPTION OF THE INVENTION

An object of the present invention is to provide a subrack and a module assembly comprising the subrack so as to solve the above problem. The objects of the invention are achieved by a subrack described in the following.

The invention is based on the idea of providing a subrack, which is adapted to receive a device module, with a subrack connector system and a coupling system, wherein the subrack connector system is adapted to be in electrically conducting connection with a device module connector system of the device module, and the coupling system is adapted for coupling the subrack to four other subracks in order to form a subrack matrix. The coupling system allows coupling the subrack to an adjacent subrack or to an electrical cabinet by screws installed from inside the subrack.

An advantage of the subrack of the invention is that a connector system adapted to co-operate with a device module connector system is always correctly aligned with the device module connector system since the subrack is provided with a subrack connector system. Since the subrack of the invention allows forming subrack matrixes of unlimited sizes, an electrical cabinet can be furnished with a required number of device modules such that each of the device modules is received in a corresponding subrack.

BRIEF DESCRIPTION OF THE DRAWINGS

In the following the invention will be described in greater detail by means of preferred embodiments with reference to the attached drawings, in which.

DETAILED DESCRIPTION OF THE INVENTION

Figure 1:
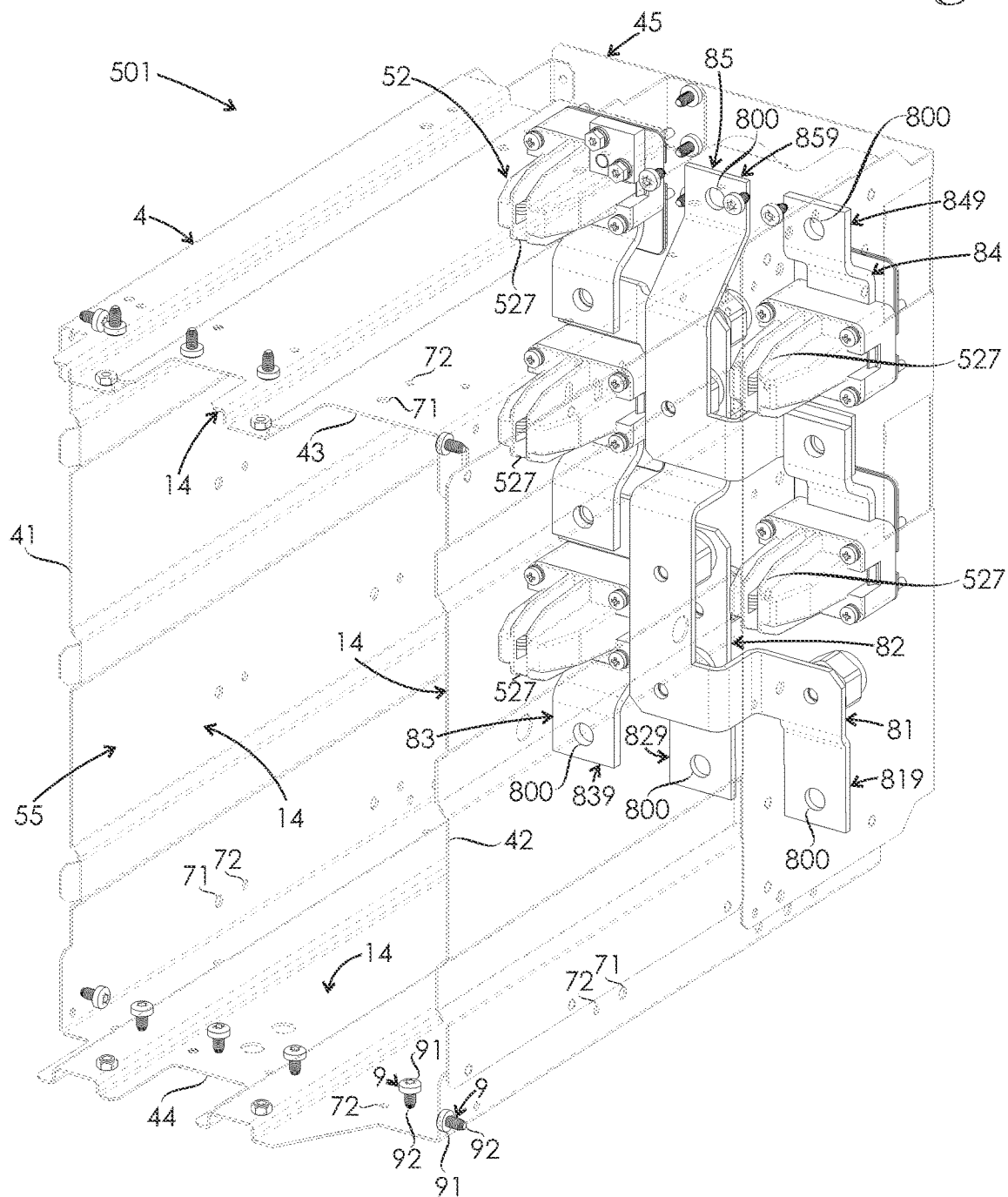
FIG. 1 shows a subrack according to an embodiment of the invention.

FIG. 1 shows a subrack 501 comprising a frame 4, a subrack connector system 52, a bus bar system, and a coupling system adapted for coupling the subrack 501 to four other identical subracks 501 in order to form a subrack matrix. The frame 4 comprises four side walls 41-44 and an end wall 45 such that the side walls 41-44 and the end wall 45 together define a subrack space 55. The frame 4 is adapted to receive a device module to an operative position in which the device module is located in the subrack space 55. The frame 4 is depicted as a transparent structure in order to better show components inside the frame 4.

Side wall 41 is parallel to and spaced apart from side wall 42. Side wall 43 is parallel to and spaced apart from side wall 44. Side walls 43 and 44 are perpendicular to side walls 41 and 42. Side walls 43 and 44 connect side walls 41 and 42 together. Side walls 41 and 42 are longer than side walls 43 and 44. End wall 45 is perpendicular to the side walls 41-44.

Figure 2:
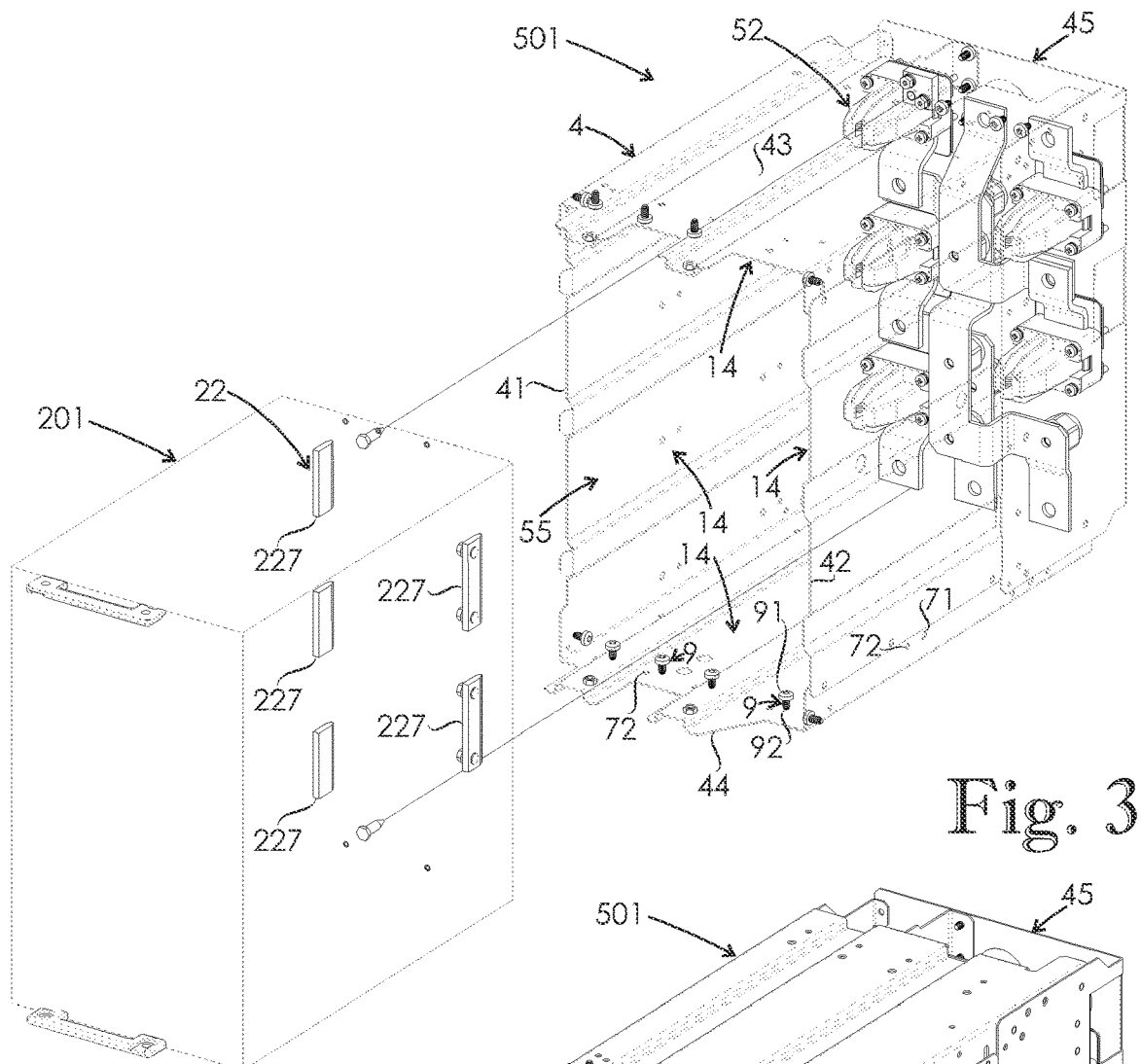
FIG. 2 shows a module assembly comprising the subrack of FIG. 1 and a device module in a disconnected position relative to the subrack.
Figure 3:
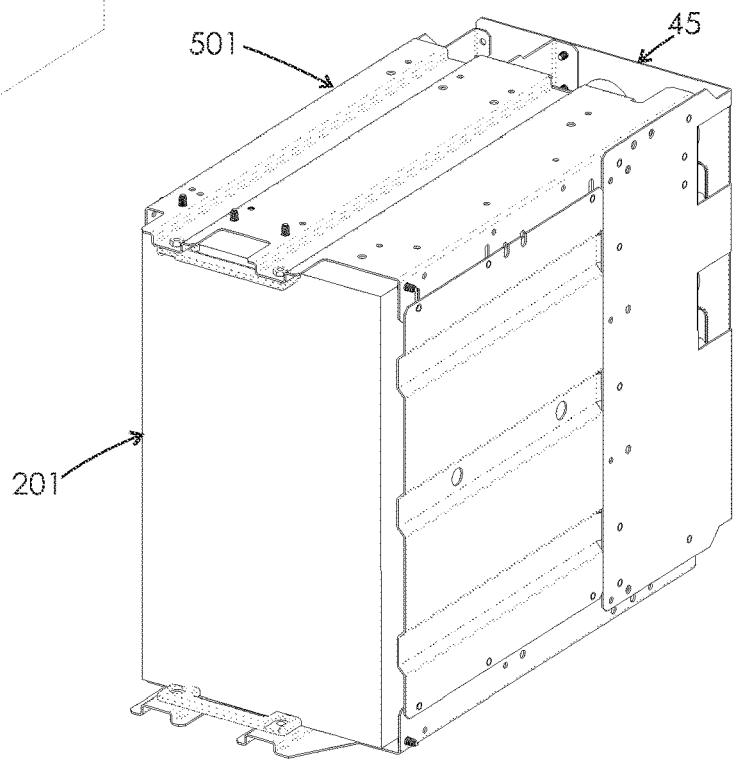
FIG. 3 shows the module assembly of FIG. 2 in a situation where the device module is in an operative position relative to the subrack.

FIG. 2 shows a module assembly comprising the subrack 501 of FIG. 1, and a device module 201 in a disconnected position relative to the subrack 501. The device module 201 is adapted to be connected in a connecting event to the operative position relative to the subrack 501. During the connecting event, a relative movement between the device module 201 and the subrack 501 is linear, and parallel to a depth direction of the subrack 501. The frame 4 of the subrack 501 and the device module 201 are depicted as transparent structures in order to better show components inside them. FIG. 3 shows the module assembly of FIG. 2 in a situation where the device module 201 is in the operative position relative to the subrack 501.

The device module 201 comprises an electrical device (not depicted), and a device module connector system 22. In an embodiment the electrical device of the device module comprises a frequency converter. In another embodiment the electrical device of the device module comprises an LCL filter.

The subrack connector system 52 is adapted to be in electrically conducting connection with the device module connector system 22 of the device module 201 while the device module 201 is in the operative position. The subrack connector system 52 comprises a plurality of subrack connectors 527 fastened to the end wall 45 such that the plurality of subrack connectors 527 is accessible from the subrack space 55.

The coupling system comprises wall recesses 14 on an inner surface of each of the side walls 41-44, and a plurality of primary screw holes 71 in each of the side walls 41-44 such that each of the plurality of primary screw holes 71 is located in one of the wall recesses 14. Each of the wall recesses 14 is adapted to accommodate screw heads 91 of screws 9 mounted to primary screw holes 71 located in the wall recess 14, and extending outwards from the wall recess 14 through the primary screw holes 71 such that the subrack space 55 is adapted to receive the device module 201 to the operative position while there is a corresponding screw 9 mounted in each of the primary screw holes 71. Due to the wall recesses 14, the device module 201 in the operative position is not in contact with the screws 9 mounted in the primary screw holes 71.

In FIGS. 1 and 2, some of the primary screw holes 71 are provided with screws 9 while others are empty. The screws 9 are self-tapping screws. In an embodiment, only one screw per side wall is required for coupling the subrack to four other sub racks.

In addition to the plurality of primary screw holes 71, the coupling system comprises a plurality of secondary screw holes 72 in each of the side walls 41-44 such that each of the plurality of secondary screw holes 72 is located in one of the wall recesses 14. Each of the wall recesses 14 is adapted to accommodate screw tips 92 of screws 9 mounted to secondary screw holes 72 located in the wall recess 14, and extending inwards to the wall recess 14 through the secondary screw holes 72 such that the subrack space 55 is adapted to receive the device module 201 to the operative position while there is a corresponding screw 9 mounted in each of the secondary screw holes 72.

The screw head 91 of the screw 9 is adapted to be engaged by a tool for turning the screw 9. The screw tip 92 of the screw 9 is located at an opposite end of the screw 9 than the screw head 91. A diameter of the screw head 91 is larger than a diameter of the screw tip 92.

The primary screw holes 71 and the secondary screw holes 72 are unthreaded holes, and diameters of the secondary screw holes 72 are smaller than diameters of the primary screw holes 71. The primary screw holes 71 and the secondary screw holes 72 are located asymmetrically in the frame 4 such that when the subrack 501 is coupled to four adjacent subracks with the coupling system, each primary screw hole 71 of the subrack 501 is adjacent to and coaxial with a secondary screw hole of one of the adjacent subracks. The self-tapping screws form threads at least to the secondary screw holes 72.

In an alternative embodiment the coupling system comprises only primary screw holes and no secondary screw holes, and the primary screw holes are threaded holes. In said embodiments screws do not have to be self-tapping screws.

Figure 4:
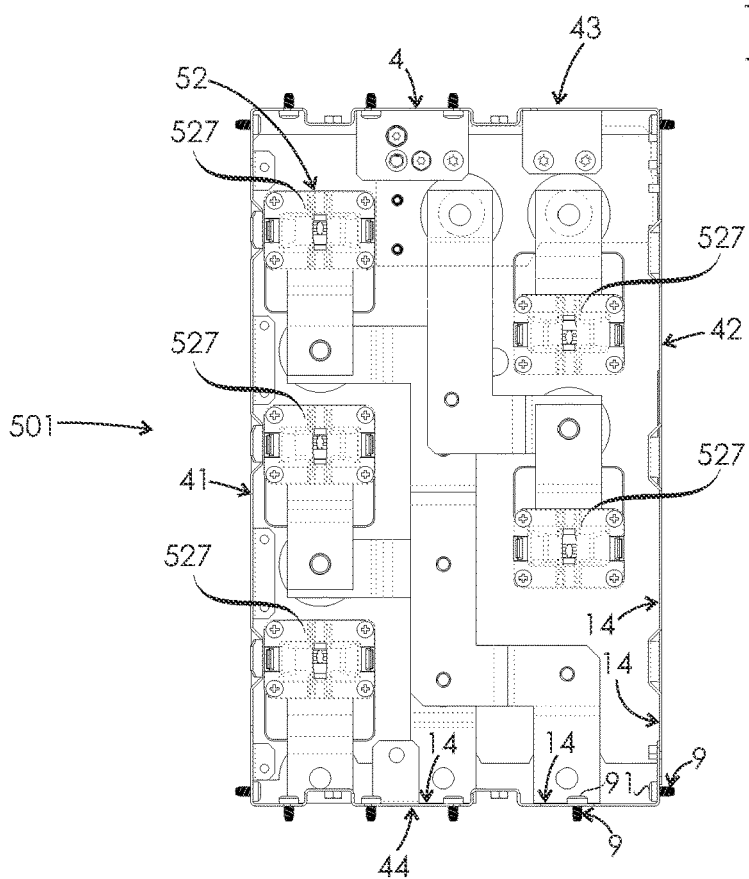
FIG. 4 shows the subrack of FIG. 1 from a direction perpendicular to an end wall of a frame of the subrack.
Figure 5:
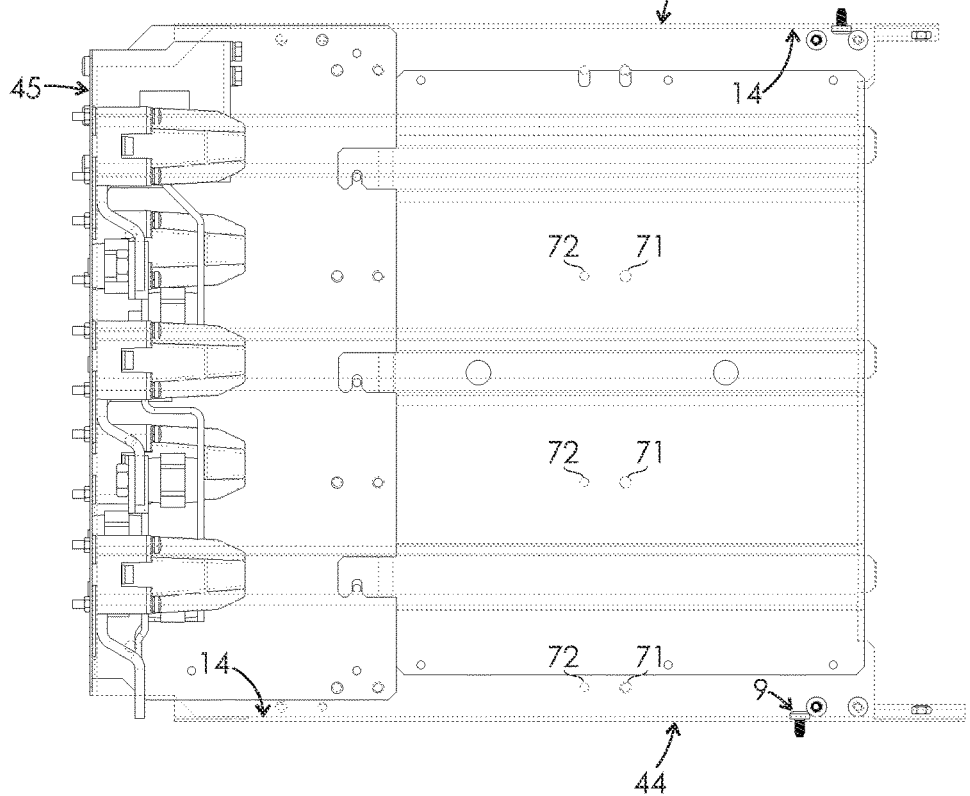
FIG. 5 shows the subrack of FIG. 1 from a direction parallel to the end wall of the frame of the subrack.

FIG. 4 shows the subrack 501 from a direction perpendicular to the end wall 45 of the frame of the subrack. Depth of the wall recesses 14 is best seen in FIG. 4. FIG. 5 shows the subrack 501 from a direction parallel to the end wall 45 of the frame of the subrack.

The bus bar system has five bus bars 81-85, and is electrically conductively connected to the subrack connector system 52. The bus bar system is accessible from outside the frame 4.

Each of the bus bars 81-85 is formed from sheet metal. Bus bars 83 and 84 are one-piece components, and bus bars 81, 82 and 85 each comprises two bent pieces of sheet metal.

Each of the bus bars 81-85 has a bus bar terminal comprising a terminal hole 800 whose centre axis extends perpendicular to a plane defined by the end wall 45. The bus bar terminal are denoted with reference numbers 819-859. Each of the terminal holes 800 is a threaded hole. There is a space for a cable terminal adjacent each of the terminal holes 800 such that each of the bus bar terminals 819-859 is adapted to be electrically conductively connected to a cable terminal of a corresponding cable extending outside the subrack 501. A cable terminal is adapted to be connected to a corresponding bus bar terminal by a bolt screwed to a terminal hole of the bus bar terminal.

In an alternative embodiment terminal holes are unthreaded holes. In a further alternative embodiment, terminal holes in sheet metal material of the bus bars are unthreaded holes but there is a nut connected adjacent to each of the terminal holes such that a thread of the nut is coaxial with the terminal hole.

The subrack connector system 52 is adapted to enable connecting the device module 201 into the operative position simply by pushing the device module 201 into the subrack space 55, wherein said pushing establishes the electrically conducting connection between the subrack connector system 52 and the device module connector system 22. Device module connectors 227 of the device module connector system 22 are knife contacts, and subrack connectors 527 are adapted to receive the knife contacts.

The subrack space 55 has generally a shape of a rectangular parallelepiped, and the device module 201 has generally a shape of a rectangular parallelepiped such that when the device module 201 is in the operative position relative to the subrack 501, outer surfaces of side walls of the device module 201 are adjacent inner surfaces of side walls 41-44 of the frame 4 of the subrack 501 thereby assuring a correct alignment between the device module connector system 22 and the subrack connector system 52. In an alternative embodiment outer surfaces of at least three side walls of the device module are in contact with adjacent at least three inner surfaces of side walls of the frame of the subrack thereby assuring a correct alignment between the device module connector system and the subrack connector system.

Figure 6:
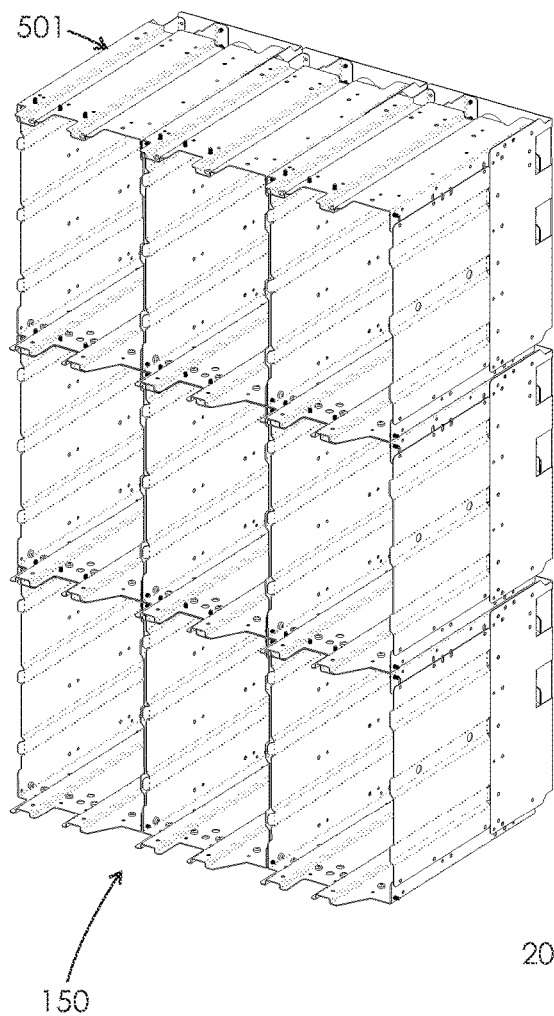
FIG. 6 shows a subrack matrix comprising nine subracks of FIG. 1.

FIG. 6 shows a subrack matrix 150 comprising nine subracks 501 coupled together by means of the coupling systems thereof. The subrack in the middle of the subrack matrix 150 is coupled to four other subracks by means of the coupling system such that the subrack in the middle is coupled to subracks adjacent to the four side walls. Planes defined by end walls of the subracks 501 in the subrack matrix 150 coincide with each other.

Figure 7:
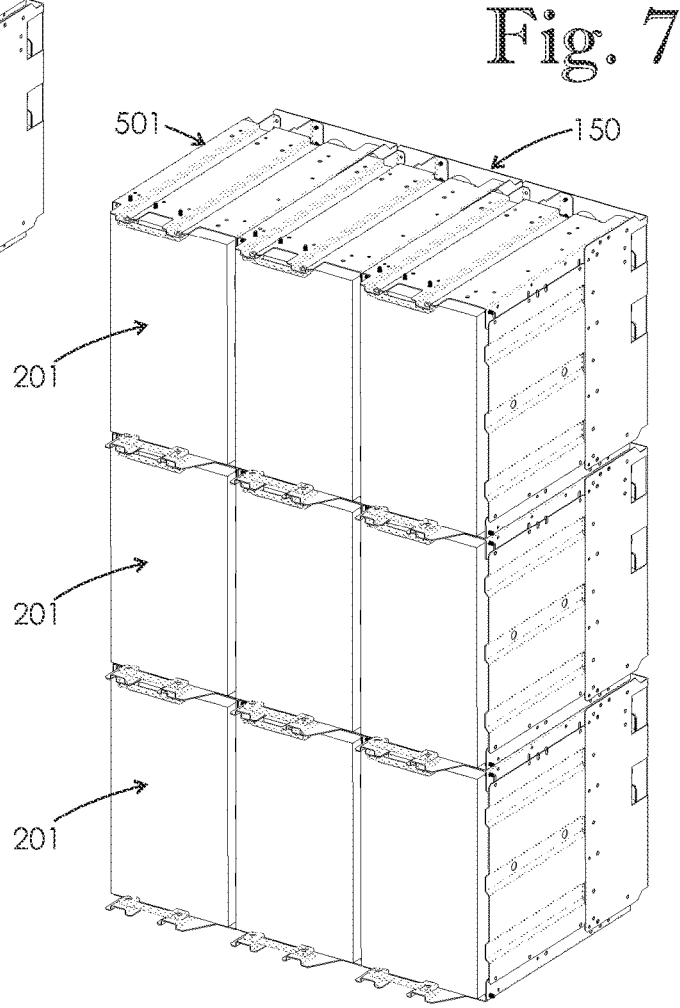
FIG. 7 shows a module assembly comprising the subrack matrix of FIG. 6 and nine device modules received in the subrack matrix.

FIG. 7 shows a module assembly comprising the subrack matrix 150 of FIG. 6 and nine device modules 201 received in the subrack matrix 150. Planes defined by front walls of the device modules 201 coincide with each other.

In an embodiment, the module assembly of FIG. 7 is mounted in an electrical cabinet (not depicted). In said embodiment, the subrack matrix 150 is located inside the electrical cabinet, and is coupled to the electrical cabinet with the coupling systems of the subracks 501 in the subrack matrix 150. In an alternative embodiment, the subrack matrix functions as an independent support structure, and no electrical cabinet is required.

Figure 8:
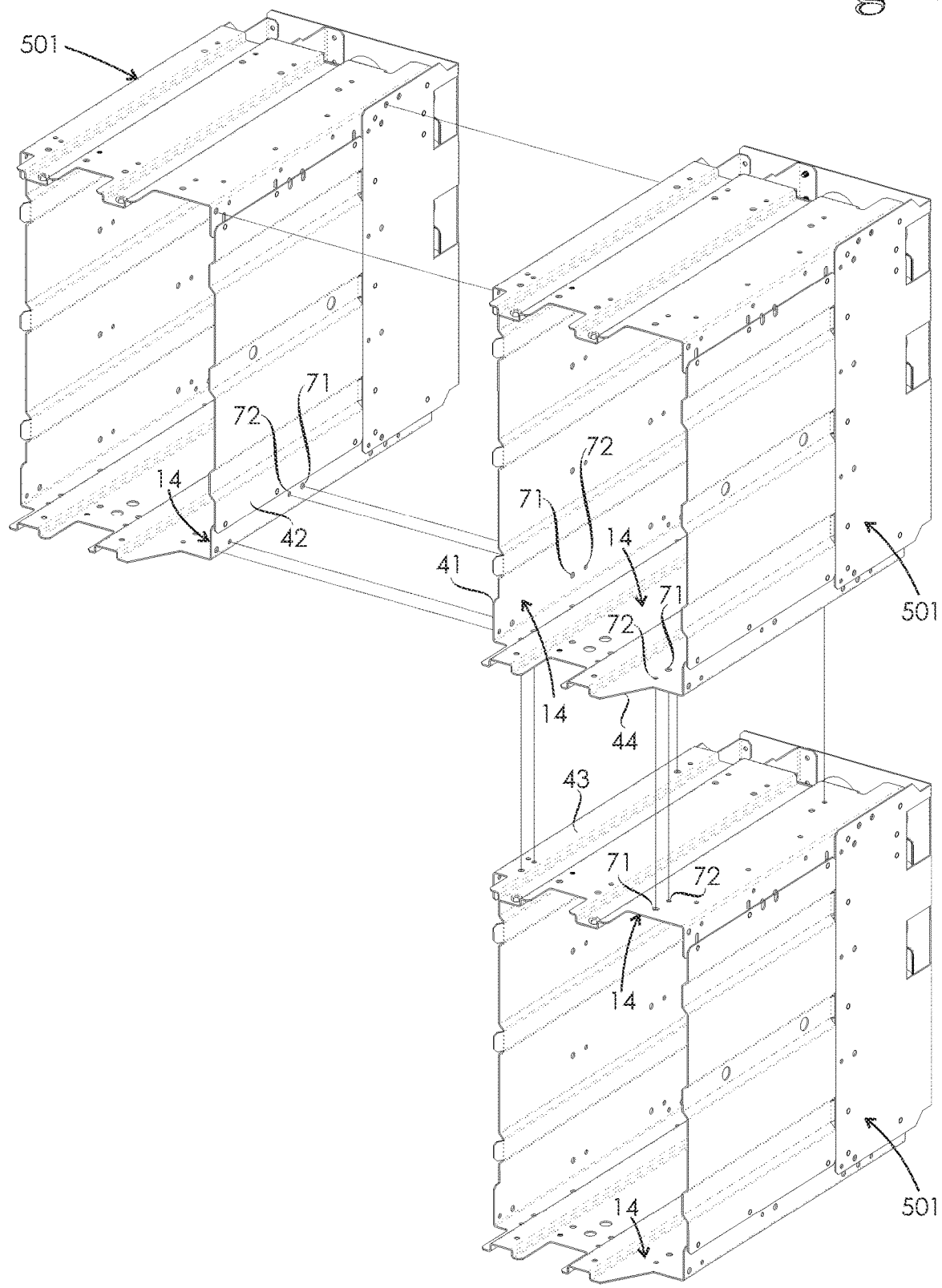
FIG. 8 illustrates coupling of three subracks of FIG. 1 together by means of coupling systems thereof comprising primary and secondary screw holes located asymmetrically in the frames of the subracks.

FIG. 8 illustrates coupling of three subracks 501 together by means of coupling systems of the subracks 501. Sidewall 42 of a subrack on the left is adapted to be adjacent to sidewall 41 of a subrack in the middle. Sidewall 44 of the subrack in the middle is adapted to be adjacent to sidewall 43 of a subrack below. When the three subracks are coupled together, primary screw holes 71 in side wall 42 of the subrack on the left are adjacent to and coaxial with secondary screw holes 72 in side wall 41 of the subrack in the middle. Further, primary screw holes 71 in side wall 44 of the subrack in the middle are adjacent to and coaxial with secondary screw holes 72 in side wall 43 of the subrack below.

It will be obvious to a person skilled in the art that the inventive concept can be implemented in various ways. The invention and its embodiments are not limited to the examples described above but may vary within the scope of the claims.

The invention claimed is:

1. A subrack comprising:
   a frame defining a subrack space and adapted to receive a device module to an operative position in which the device module is located in the subrack space, the frame comprising four side walls and an end wall;
   a subrack connector system adapted to be in electrically conducting connection with a device module connector system of the device module while the device module is in the operative position, the subrack connector system comprising a plurality of subrack connectors fastened to the end wall such that the plurality of subrack connectors is accessible from the subrack space,
   wherein the subrack comprises a coupling system adapted for coupling the subrack to four other subracks in order to form a subrack matrix, the coupling system comprising at least one wall recess on an inner surface of each of the side walls, and at least one primary screw hole in each of the side walls such that the at least one primary screw hole is located in the at least one wall recess, wherein each of the wall recesses is adapted to accommodate screw heads of at least one screw mounted to the at least one primary screw hole located in the wall recess, and extending outwards from the wall recess through the at least one primary screw hole such that the subrack space is adapted to receive the device module to the operative position while there is a corresponding screw mounted in each of the at least one primary screw hole.

2. The subrack as claimed in claim 1, wherein the subrack comprises a bus bar system having a plurality of bus bars, the bus bar system being electrically conductively connected to the subrack connector system, and accessible from outside the frame.

3. The subrack as claimed in claim 2, wherein each of the plurality of bus bars has a bus bar terminal comprising a terminal hole whose centre axis extends perpendicular to a plane defined by the end wall.

4. The subrack as claimed in claim 3, wherein each of the terminal holes is a threaded hole.

5. The subrack as claimed in claim 4, wherein each of the bus bar terminals is adapted to be electrically conductively connected to a cable terminal of a corresponding cable extending outside the subrack.

6. The subrack as claimed in claim 3, wherein each of the bus bar terminals is adapted to be electrically conductively connected to a cable terminal of a corresponding cable extending outside the subrack.

7. The subrack as claimed in claim 2, wherein each of the plurality of bus bars is formed from sheet metal.

8. The subrack as claimed in claim 1, wherein the subrack connector system is adapted to enable connecting the device module into the operative position simply by pushing the device module into the subrack space, wherein said pushing establishes the electrically conducting connection between the subrack connector system and the device module connector system.

9. The subrack as claimed in claim 1, wherein the coupling system comprises at least one secondary screw hole in each of the side walls such that the at least one secondary screw hole is located in the at least one wall recess, wherein each of the wall recesses is adapted to accommodate screw tips of at least one screw mounted to the at least one secondary screw hole located in the wall recess, and extending inwards to the wall recess through the at least one secondary screw hole such that the subrack space is adapted to receive the device module to the operative position while there is a corresponding screw mounted in each of the at least one secondary screw hole.

10. The subrack as claimed in claim 9, wherein the at least one primary screw hole and the at least one secondary screw hole are unthreaded holes, and a diameter of the at least one secondary screw hole is smaller than the diameter of the at least one primary screw hole, and the at least one primary screw hole and the at least one secondary screw hole are located asymmetrically in the frame such that when the subrack is coupled to four adjacent subracks with the coupling system, each primary screw hole of the subrack is adjacent to and coaxial with a secondary screw hole of one of the four adjacent subracks.

11. A module assembly comprising:
    a subrack;
       a frame defining a subrack space and adapted to receive a device module to an operative position in which the device module is located in the subrack space, the frame comprising four side walls and an end wall;
       a subrack connector system adapted to be in electrically conducting connection with a device module connector system of the device module while the device module is in the operative position, the subrack connector system comprising a plurality of subrack connectors fastened to the end wall such that the plurality of subrack connectors is accessible from the subrack space,
       wherein the subrack comprises a coupling system adapted for coupling the subrack to four other subracks in order to form a subrack matrix, the coupling system comprising at least one wall recess on an inner surface of each of the side walls, and at least one primary screw hole in each of the side walls such that the at least one primary screw hole is located in the at least one wall recess wherein each of the wall recesses is adapted to accommodate screw heads of at least one screw mounted to the at least one primary screw hole located in the wall recess, and extending outwards from the wall recess through the at least one primary screw hole such that the subrack space is adapted to receive the device module to the operative position while there is a corresponding screw mounted in each of the at least one primary screw hole; and a device module including at least one electrical device, and a device module connector system, wherein the device module is adapted to be connected in a connecting event to an operative position relative to the subrack such that in the operative position the device module connector system is electrically conductively connected to the subrack connector system.

12. The module assembly as claimed in claim 11, wherein the subrack space has generally a shape of a rectangular parallelepiped, and the device module has generally a shape of a rectangular parallelepiped such that when the device module is in the operative position relative to the subrack, outer surfaces of side walls of the device module are adjacent inner surfaces of side walls of the frame of the subrack thereby assuring a correct alignment between the device module connector system and the subrack connector system.

13. The module assembly as claimed in claim 12, wherein the module assembly comprises a plurality of subracks coupled as a subrack matrix, and a device module for each of the plurality of subracks.

14. The module assembly as claimed in claim 11, module assembly comprises a plurality of subracks coupled as a subrack matrix, and a device module for each of the plurality of subracks.

15. The module assembly as claimed in claim 14, wherein planes defined by end walls of the subracks in the subrack matrix coincide with each other.

16. The module assembly as claimed in claim 15, wherein the module assembly comprises an electrical cabinet, and the subrack matrix is located inside the electrical cabinet, and is coupled to the electrical cabinet with the coupling systems of the subracks in the subrack matrix.

17. The module assembly as claimed in claim 14, wherein the module assembly comprises an electrical cabinet, and the subrack matrix is located inside the electrical cabinet, and is coupled to the electrical cabinet with the coupling systems of the subracks in the subrack matrix.

* * * * *